United States Patent
Yang et al.

(10) Patent No.: US 11,984,978 B2
(45) Date of Patent: May 14, 2024

(54) NON-COHERENT COMMUNICATIONS ASSOCIATED WITH POLAR CODING

(71) Applicant: QUALCOMM Incorporated, San Diego, CA (US)

(72) Inventors: Wei Yang, San Diego, CA (US); Hwan Joon Kwon, San Diego, CA (US); Yi Huang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 269 days.

(21) Appl. No.: 17/504,362

(22) Filed: Oct. 18, 2021

(65) Prior Publication Data

US 2022/0123861 A1 Apr. 21, 2022

Related U.S. Application Data

(60) Provisional application No. 63/093,711, filed on Oct. 19, 2020.

(51) Int. Cl.
*H04L 1/00* (2006.01)

(52) U.S. Cl.
CPC .................................. *H04L 1/0057* (2013.01)

(58) Field of Classification Search
CPC ..... H03M 13/13; H03M 13/33; H04L 1/0041; H04L 1/0057
USPC ......................................................... 370/329
See application file for complete search history.

(56) References Cited

U.S. PATENT DOCUMENTS

| | | | | |
|---|---|---|---|---|
| 2017/0257186 A1* | 9/2017 | Ge | ........................ | H04L 1/0061 |
| 2019/0044540 A1* | 2/2019 | Jiang | ................ | H03M 13/2796 |
| 2019/0296857 A1* | 9/2019 | Gritsenko | ......... | H03M 13/3769 |
| 2019/0372712 A1* | 12/2019 | Yang | ..................... | H04L 1/0057 |
| 2020/0067530 A1* | 2/2020 | Xu | ....................... | H03M 13/353 |
| 2020/0403728 A1* | 12/2020 | Chen | ..................... | H03M 13/13 |
| 2021/0050865 A1* | 2/2021 | Li | ..................... | H03M 13/6306 |
| 2021/0135783 A1* | 5/2021 | Yang | .................. | H03M 13/033 |
| 2021/0152290 A1* | 5/2021 | Li | ......................... | H04L 1/0067 |
| 2022/0140946 A1* | 5/2022 | Chen | ..................... | H04L 1/1819 |
| | | | | 370/328 |

* cited by examiner

*Primary Examiner* — Robert J Lopata
(74) *Attorney, Agent, or Firm* — Kevin M. Donnelly; Seyfarth Shaw LLP

(57) ABSTRACT

A method of non-coherent wireless communication performed by a wireless communication device includes generating information bits for transmission to another wireless communication device. The method also includes identifying a configuration for a polar code encoder for encoding the information bits. The method further includes encoding a set of the information bits with a polar code encoding operation based on the configuration to generate a codeword, the configuration rendering the polar code encoding operation incapable of generating a codeword that is a bit-flipped counterpart of another codeword that the polar code encoding operation is capable of generating based on the configuration. The method still further includes transmitting the codeword via a wireless channel without a reference signal.

28 Claims, 14 Drawing Sheets

Coherent Communications System bit locations →

| $u_0$ | $u_1$ | $u_2$ | $u_3$ | $u_4$ | $u_5$ | $u_6$ | $u_7$ |
|---|---|---|---|---|---|---|---|
| | | | x | | x | x | x |
| 0 | 0 | 0 | 0 | 0 | 0 | 0 | 1 |
| 0 | 0 | 0 | 0 | 0 | 0 | 1 | 1 |
| 0 | 0 | 0 | 0 | 0 | 1 | 0 | 1 |
| 0 | 0 | 0 | 0 | 1 | 1 | 1 | 1 |
| 0 | 0 | 0 | 1 | 0 | 0 | 0 | 1 |
| 0 | 0 | 1 | 1 | 0 | 0 | 1 | 1 |
| 0 | 1 | 0 | 1 | 0 | 1 | 0 | 1 |
| 1 | 1 | 1 | 1 | 1 | 1 | 1 | 1 |

NON-COHERENT COMMUNICATIONS ASSOCIATED WITH POLAR CODING

CROSS-REFERENCE TO RELATED APPLICATION

The present application claims the benefit of U.S. Provisional Patent Application No. 63/093,711, filed on Oct. 19, 2020, and titled "NON-COHERENT COMMUNICATIONS ASSOCIATED WITH POLAR CODING," the disclosure of which is expressly incorporated by reference in its entirety.

FIELD OF THE DISCLOSURE

Aspects of the present disclosure generally relate to wireless communications, and more particularly to non-coherent communication using polar coding techniques.

BACKGROUND

Wireless communications systems are widely deployed to provide various telecommunications services such as telephony, video, data, messaging, and broadcasts. Typical wireless communications systems may employ multiple-access technologies capable of supporting communications with multiple users by sharing available system resources (for example, bandwidth, transmit power, and/or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and long term evolution (LTE). LTE/LTE-Advanced is a set of enhancements to the universal mobile telecommunications system (UMTS) mobile standard promulgated by the Third Generation Partnership Project (3GPP).

A wireless communications network may include a number of base stations (BSs) that can support communications for a number of user equipment (UEs). A user equipment (UE) may communicate with a base station (BS) via the downlink and uplink. The downlink (or forward link) refers to the communications link from the BS to the UE, and the uplink (or reverse link) refers to the communications link from the UE to the BS. As will be described in more detail, a BS may be referred to as a Node B, a gNB, an access point (AP), a radio head, a transmit and receive point (TRP), a new radio (NR) BS, a 5G Node B, and/or the like.

The above multiple access technologies have been adopted in various telecommunications standards to provide a common protocol that enables different user equipment to communicate on a municipal, national, regional, and even global level. New radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (for example, also known as discrete Fourier transform spread OFDM (DFT-s-OFDM)) on the uplink (UL), as well as supporting beamforming, multiple-input multiple-output (MIMO) antenna technology, and carrier aggregation.

Wireless communication systems may use coherent communication techniques. Coherent communication refers to communication in which a known sequence or pilot signal, such as a demodulation reference signal (DMRS) in LTE and 5G NR systems, is transmitted in conjunction with another signal, such as a data signal. A receiver may receive the known sequence and perform measurements of it to obtain channel state information (CSI) to aid in the reception of data. Coherent communication, such as DMRS-based communication, may be suboptimal in some wireless environments, such as when a UE is located at a cell edge where a signal received from a base station has a low signal-to-noise ratio (SNR). To improve performance when received signals have a low SNR, non-coherent communications may be considered. A non-coherent communication may be a communication that does not include a known sequence, a pilot signal, or a DMRS with another signal, such as a data signal. In some cases, however, non-coherent communication techniques may result in poor performance. In some examples, for some modulation schemes, a receiver may fail to decode a non-coherent communication because a channel phase may be unknown. Decoding errors may also occur for a non-coherent communication received on a fading channel.

SUMMARY

In one aspect of the present disclosure, a method for non-coherent wireless communication at a wireless communication device is disclosed. The method includes generating information bits for transmission to another wireless communication device. The method also includes identifying a configuration for a polar code encoder for encoding the information bits. The method further includes encoding a set of the information bits with a polar code encoding operation based on the configuration to generate a codeword. The configuration may render the polar code encoding operation incapable of generating a codeword that is a bit-flipped counterpart of another codeword that the polar code encoding operation is capable of generating based on the configuration. The method still further includes transmitting the codeword via a wireless channel without a reference signal.

Another aspect of the present disclosure is directed to an apparatus including means for generating information bits for transmission to another wireless communication device. The apparatus also includes means for identifying a configuration for a polar code encoder for encoding the information bits. The apparatus further includes means for encoding a set of the information bits with a polar code encoding operation based on the configuration to generate a codeword. The configuration may render the polar code encoding operation incapable of generating a codeword that is a bit-flipped counterpart of another codeword that the polar code encoding operation is capable of generating based on the configuration. The apparatus still further includes means for transmitting the codeword via a wireless channel without a reference signal.

In another aspect of the present disclosure, a non-transitory computer-readable medium with non-transitory program code recorded thereon is disclosed. The program code is for non-coherent wireless communication by a wireless communication device. The program code is executed by a processor and includes program code to generate information bits for transmission to another wireless communication device. The program code also includes program code to identify a configuration for a polar code encoder for encoding the information bits. The program code further includes program code to encode a set of the information bits with a polar code encoding operation based on the configuration to generate a codeword. The configuration may render the polar code encoding operation incapable of generating a codeword that is a bit-flipped counterpart of another codeword that the polar code encoding operation is capable of generating based on the configuration. The program code still further includes program code to transmit the codeword via a wireless channel without a reference signal.

Another aspect of the present disclosure is directed to an apparatus. The apparatus having a memory, one or more processors coupled to the memory, and instructions stored in the memory. The instructions being operable, when executed by the processor, to cause the apparatus to generate information bits for transmission to another wireless communication device. Execution of the instructions also cause the apparatus to identify a configuration for a polar code encoder for encoding the information bits. Execution of the instructions additionally cause the apparatus to encode a set of the information bits with a polar code encoding operation based on the configuration to generate a codeword. The configuration may render the polar code encoding operation incapable of generating a codeword that is a bit-flipped counterpart of another codeword that the polar code encoding operation is capable of generating based on the configuration. Execution of the instructions further cause the apparatus to transmitting the codeword via a wireless channel without a reference signal.

In one aspect of the present disclosure, a method for non-coherent wireless communication by a wireless device is disclosed. The method includes performing a rate matching operation on a set of information bits to adjust a quantity of bits in a codeword. The method also includes encoding the information bits with a first polar code encoding operation to generate the codeword based on a type of the rate matching satisfying a first polar code encoding condition. The method further includes transmitting the codeword via a wireless channel without a reference signal.

Another aspect of the present disclosure is directed to an apparatus including means for performing a rate matching operation on a set of information bits to adjust a quantity of bits in a codeword. The apparatus also includes means for encoding the information bits with a first polar code encoding operation to generate the codeword based on a type of the rate matching satisfying a first polar code encoding condition. The apparatus further includes means for transmitting the codeword via a wireless channel without a reference signal.

In another aspect of the present disclosure, a non-transitory computer-readable medium with non-transitory program code recorded thereon is disclosed. The program code is executed by a processor and includes program code to perform a rate matching operation on a set of information bits to adjust a quantity of bits in a codeword. The program code also includes program code to encode the information bits with a first polar code encoding operation to generate the codeword based on a type of the rate matching satisfying a first polar code encoding condition. The program code further includes program code to transmit the codeword via a wireless channel without a reference signal.

Another aspect of the present disclosure is directed to an apparatus. The apparatus having a memory, one or more processors coupled to the memory, and instructions stored in the memory. The instructions being operable, when executed by the processor, to cause the apparatus to performing a rate matching operation on a set of information bits to adjust a quantity of bits in a codeword. Execution of the instructions also cause the apparatus to encode the information bits with a first polar code encoding operation to generate the codeword based on a type of the rate matching satisfying a first polar code encoding condition. Execution of the instructions additionally cause the apparatus to transmit the codeword via a wireless channel without a reference signal.

Aspects generally include a method, apparatus, system, computer program product, non-transitory computer-readable medium, user equipment, base station, wireless communications device, and processing system as substantially described with reference to and as illustrated by the accompanying drawings and specification.

The foregoing has outlined rather broadly the features and technical advantages of examples according to the disclosure in order that the detailed description that follows may be better understood. Additional features and advantages will be described. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that features of the present disclosure can be understood in detail, a particular description may be had by reference to aspects, some of which are illustrated in the appended drawings. It is to be noted, however, that the appended drawings illustrate only certain aspects of this disclosure and are therefore not to be considered limiting of its scope, for the description may admit to other equally effective aspects. The same reference numbers in different drawings may identify the same or similar elements.

FIG. 5A is a diagram illustrating a Hadamard matrix from which a generator matrix of a polar may be constructed.

FIG. 5B is a diagram illustrating a generator matrix.

DETAILED DESCRIPTION

Figure 1:
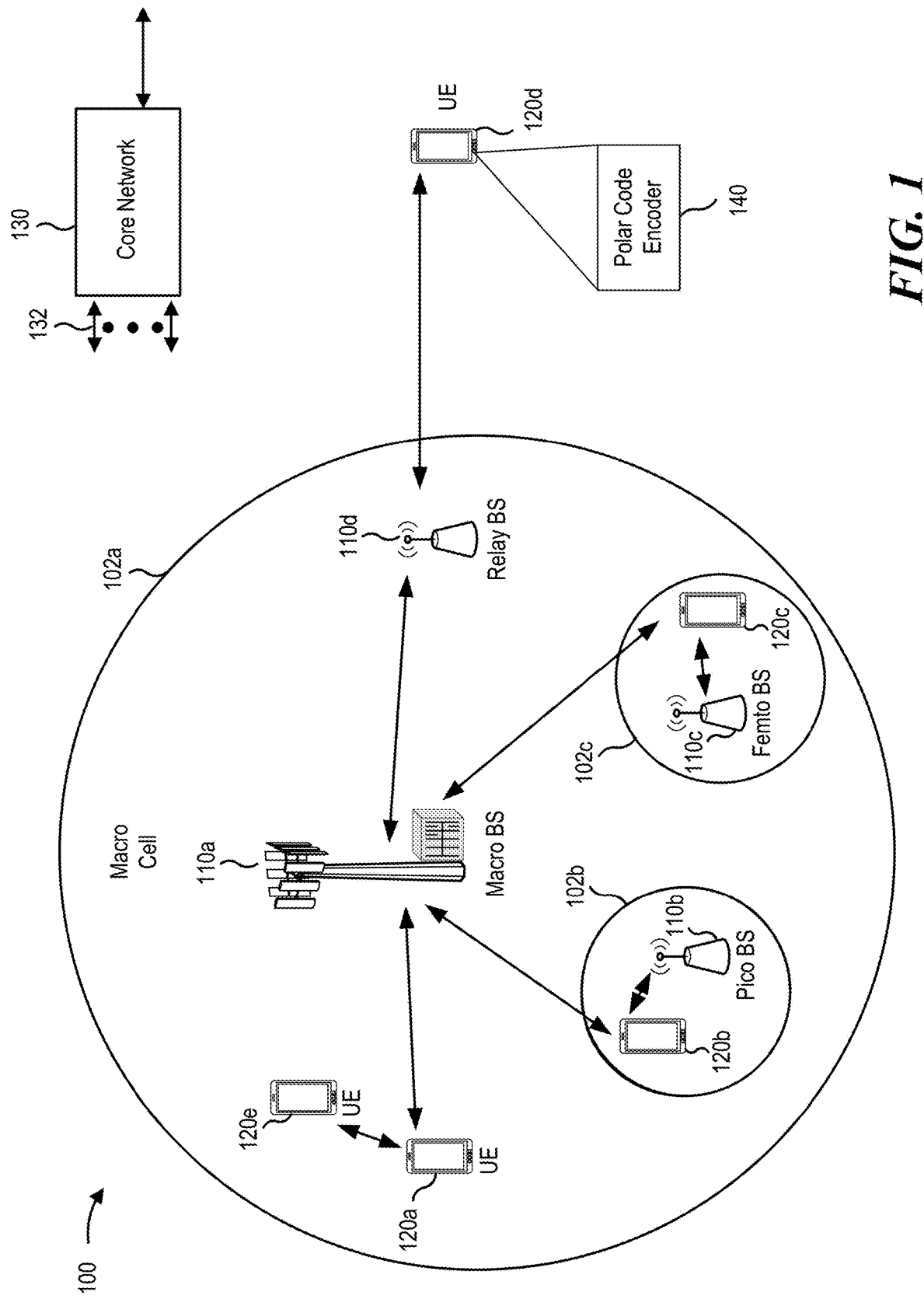
FIG. 1 is a block diagram conceptually illustrating an example of a wireless communications network, in accordance with various aspects of the present disclosure.

Various aspects of the disclosure are described more fully below with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings, one skilled in the art should appreciate that the scope of the disclosure is intended to cover any aspect of the disclosure, whether implemented independently of or combined with any other aspect of the disclosure. For example, an apparatus may be implemented or a method may be practiced using any number of the aspects set forth. In addition, the scope of the disclosure is intended to cover such an apparatus or method, which is practiced using other structure, functionality, or structure and functionality in addition to or other than the various aspects of the disclosure set forth. It should be understood that any aspect of the disclosure disclosed may be embodied by one or more elements of a claim.

Several aspects of telecommunications systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

Typical wireless communication systems use coherent communication techniques to transmit a known sequence, such as a pilot signal (for example, a demodulation reference signal (DMRS)), in conjunction with another signal, such as a data signal. A receiver may receive and measure the known sequence. In some examples, the measurements may be used for channel estimation or channel synchronization. A coherent communication may also be referred to as a DMRS-based communication. Coherent communications may not be optimal in some wireless communication environments or scenarios, such as when a receiver is located at a cell edge where a signal received from a transmitter has a low signal-to-noise ratio (SNR). To improve performance when received signals have a low SNR, non-coherent communication, also referred to as DMRS-less communication, techniques may be considered in which a pilot signal, such as a DMRS, is not transmitted in conjunction with data or another signal.

In some non-coherent communication systems, a transmitter may transmit an encoded payload using an existing coding scheme without a pilot signal, such as a DMRS, even in instances of a fading channel. Such non-coherent communication techniques may reduce network communication quality. In some examples, an encoder, such as a polar code encoder, of a transmitter may generate a pair of codewords that are bit-flipped relative to each other. In one such example, the encoder may generate a first codeword having a value 1001101 and a second codeword having a value 0110010. The transmitter may transmit the first and second codewords with these values, however, because of the unknown channel phase, the receiver may decode the first codeword with the flipped values 0110010 or may decode the second codeword with the flipped values 1001101. Generally, because the polar code encoder is capable of generating a pair of codewords that are bit-flipped relative to each other, the receiver may fail to distinguish two modulated codewords $x_1$ and $x_2$ if $x_1=-x_2$. A block error rate (BLER) may increase as a result of the receiver's failure to distinguish the two modulated codewords.

Various aspects disclosed herein relate generally to polar coding techniques for non-coherent communication. Some aspects more specifically relate to encoding information bits via a polar code encoding operation that is incapable of generating a codeword that is a bit-flipped counterpart of another codeword that the polar code encoder can generate. In such aspects, a transmitter, which may in some examples be a user equipment (UE), may generate information bits for a non-coherent transmission, and may identify a configuration for a polar code encoding operation for encoding the information bits. In some examples, the configuration for the polar code encoding operation may be pre-defined at the transmitter. In other examples, the transmitter may receive the configuration from another wireless communication device, such as a base station. The transmitter may then encode the information bits using the polar code encoding operation to generate a codeword, and may transmit the generated codeword as a non-coherent transmission. In some examples, the received configuration renders the polar code encoding operation incapable of generating a bit-flipped codeword that is a bit-flipped counterpart of another codeword that the polar code encoding operation is able to generate. In one such example, the polar code encoding operation is capable of generating a first codeword having values of 0110010, but incapable of generating a second codeword having values of 1001101, because the second codeword is a bit-flipped counterpart of the first codeword.

Particular aspects of the subject matter described in this disclosure may be implemented to realize one or more of the following potential advantages. In some examples, the described techniques may improve non-coherent communications by rendering the polar code encoding operation incapable of generating a bit-flipped codeword that is a bit-flipped counterpart of another codeword generated by the polar code encoding operation. In such examples, the non-coherent communications may be more reliable over a fading channel having an unknown phase. In one such example, if a transmitter transmits a codeword having values of 0110010, even if a receiver decodes the codeword with the flipped values 1001101 due to the unknown phase, the receiver will recognize the values because the polar code encoding operation may only generate one of the values 1001101 or 0110010 as a valid codeword. As such, the receiver will not have to differentiate the values 1001101 and 0110010 because the receiver knows that only one of the values is a valid codeword, and hence, the receiver will decode and output the valid codewords.

FIG. 1 is a diagram illustrating a network 100 in which aspects of the present disclosure may be practiced. The network 100 may be a 5G or NR network or some other wireless network, such as an LTE network. The wireless network 100 may include a number of BSs 110 (shown as BS 110a, BS 110b, BS 110c, and BS 110d) and other network entities. A BS is an entity that communicates with user equipment (UEs) and may also be referred to as a base station, an NR BS, a Node B, a gNB, a 5G node B (NB), an access point, a transmit and receive point (TRP), and/or the like. Each BS may provide communications coverage for a particular geographic area. In 3GPP, the term "cell" can refer to a coverage area of a BS and/or a BS subsystem serving this coverage area, depending on the context in which the term is used.

A BS may provide communications coverage for a macro cell, a pico cell, a femto cell, and/or another type of cell. A macro cell may cover a relatively large geographic area (for example, several kilometers in radius) and may allow unrestricted access by UEs with service subscription. A pico cell may cover a relatively small geographic area and may allow unrestricted access by UEs with service subscription. A femto cell may cover a relatively small geographic area (for example, a home) and may allow restricted access by UEs having association with the femto cell (for example, UEs in a closed subscriber group (CSG)). A BS for a macro cell may be referred to as a macro BS. A BS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (for example, three) cells. The terms "eNB," "base station," "NR BS," "gNB," "TRP," "AP," "node B," "5G NB," and "cell" may be used interchangeably.

In some aspects, a cell may not necessarily be stationary, and the geographic area of the cell may move according to the location of a mobile BS. In some aspects, the BSs may be interconnected to one another and/or to one or more other BSs or network nodes (not shown) in the wireless network 100 through various types of backhaul interfaces such as a direct physical connection, a virtual network, and/or the like using any suitable transport network.

The wireless network 100 may also include relay stations. A relay station is an entity that can receive a transmission of data from an upstream station (for example, a BS or a UE) and send a transmission of the data to a downstream station (for example, a UE or a BS). A relay station may also be a UE that can relay transmissions for other UEs. In the example shown in FIG. 1, a relay station 110d may communicate with macro BS 110a and a UE 120d in order to facilitate communications between the BS 110a and UE 120d. A relay station may also be referred to as a relay BS, a relay base station, a relay, and/or the like.

The wireless network 100 may be a heterogeneous network that includes BSs of different types, for example, macro BSs, pico BSs, femto BSs, relay BSs, and/or the like. These different types of BSs may have different transmit power levels, different coverage areas, and different impact on interference in the wireless network 100. For example, macro BSs may have a high transmit power level (for example, 5 to 40 Watts) whereas pico BSs, femto BSs, and relay BSs may have lower transmit power levels (for example, 0.1 to 2 Watts).

As an example, the BSs 110 (shown as BS 110a, BS 110b, BS 110c, and BS 110d) and the core network 130 may exchange communications via backhaul links 132 (for example, S1, etc.). Base stations 110 may communicate with one another over other backhaul links (for example, X2, etc.) either directly or indirectly (for example, through core network 130).

The core network 130 may be an evolved packet core (EPC), which may include at least one mobility management entity (MME), at least one serving gateway (S-GW), and at least one packet data network (PDN) gateway (P-GW). The MME may be the control node that processes the signaling between the UEs 120 and the EPC. All user IP packets may be transferred through the S-GW, which itself may be connected to the P-GW. The P-GW may provide IP address allocation as well as other functions. The P-GW may be connected to the network operator's IP services. The operator's IP services may include the Internet, the Intranet, an IP multimedia subsystem (IMS), and a packet-switched (PS) streaming service.

The core network 130 may provide user authentication, access authorization, tracking, IP connectivity, and other access, routing, or mobility functions. One or more of the base stations 110 or access node controllers (ANCs) may interface with the core network 130 through backhaul links 132 (for example, S1, S2, etc.) and may perform radio configuration and scheduling for communications with the UEs 120. In some configurations, various functions of each access network entity or base station 110 may be distributed across various network devices (for example, radio heads and access network controllers) or consolidated into a single network device (for example, a base station 110).

UEs 120 (for example, 120a, 120b, 120c) may be dispersed throughout the wireless network 100, and each UE may be stationary or mobile. A UE may also be referred to as an access terminal, a terminal, a mobile station, a subscriber unit, a station, and/or the like. A UE may be a cellular phone (for example, a smart phone), a personal digital assistant (PDA), a wireless modem, a wireless communications device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (for example, smart ring, smart bracelet)), an entertainment device (for example, a music or video device, or a satellite radio), a vehicular component or sensor, smart meters/sensors, industrial manufacturing equipment, a global positioning system device, or any other suitable device that is configured to communicate via a wireless or wired medium.

One or more UEs 120 may establish a protocol data unit (PDU) session for a network slice. In some cases, the UE 120 may select a network slice based on an application or subscription service. By having different network slices serving different applications or subscriptions, the UE 120 may improve its resource utilization in the wireless network 100, while also satisfying performance specifications of individual applications of the UE 120. In some cases, the network slices used by UE 120 may be served by an AMF (not shown in FIG. 1) associated with one or both of the base station 110 or core network 130. In addition, session management of the network slices may be performed by an access and mobility management function (AMF).

The UEs 120 may include a polar code encoder 140. For brevity, only one UE 120*d* is shown as including the polar code encoder 140. The polar code encoder 140 may generate information bits for transmission to another wireless communication device. The polar code encoder 140 may also identify a configuration for a polar code encoder for encoding the information bits. The polar code encoder 140 may encode a set of the information bits with a polar code encoding operation based on the configuration to generate a codeword, the configuration rendering the polar code encoding operation incapable of generating a codeword that is a bit-flipped counterpart of another codeword that the polar code encoding operation is capable of generating based on the configuration. The polar code encoder 140 may finally transmit the codeword via a wireless channel without a reference signal.

Some UEs may be considered machine-type communications (MTC) or evolved or enhanced machine-type communications (eMTC) UEs. MTC and eMTC UEs include, for example, robots, drones, remote devices, sensors, meters, monitors, location tags, and/or the like, that may communicate with a base station, another device (for example, remote device), or some other entity. A wireless node may provide, for example, connectivity for or to a network (for example, a wide area network such as Internet or a cellular network) via a wired or wireless communications link. Some UEs may be considered Internet-of-Things (IoT) devices, and/or may be implemented as NB-IoT (narrowband internet of things) devices. Some UEs may be considered a customer premises equipment (CPE). UE 120 may be included inside a housing that houses components of UE 120, such as processor components, memory components, and/or the like.

In general, any number of wireless networks may be deployed in a given geographic area. Each wireless network may support a particular radio access technology (RAT) and may operate on one or more frequencies. A RAT may also be referred to as a radio technology, an air interface, and/or the like. A frequency may also be referred to as a carrier, a frequency channel, and/or the like. Each frequency may support a single RAT in a given geographic area in order to avoid interference between wireless networks of different RATs. In some cases, NR or 5G RAT networks may be deployed.

In some aspects, two or more UEs 120 (for example, shown as UE 120*a* and UE 120*e*) may communicate directly using one or more sidelink channels (for example, without using a base station 110 as an intermediary to communicate with one another). For example, the UEs 120 may communicate using peer-to-peer (P2P) communications, device-to-device (D2D) communications, a vehicle-to-everything (V2X) protocol (for example, which may include a vehicle-to-vehicle (V2V) protocol, a vehicle-to-infrastructure (V2I) protocol, and/or the like), a mesh network, and/or the like. In this case, the UE 120 may perform scheduling operations, resource selection operations, and/or other operations described elsewhere as being performed by the base station 110. For example, the base station 110 may configure a UE 120 via downlink control information (DCI), radio resource control (RRC) signaling, a media access control-control element (MAC-CE) or via system information (for example, a system information block (SIB).

As indicated above, FIG. 1 is provided merely as an example. Other examples may differ from what is described with regard to FIG. 1.

Figure 2:
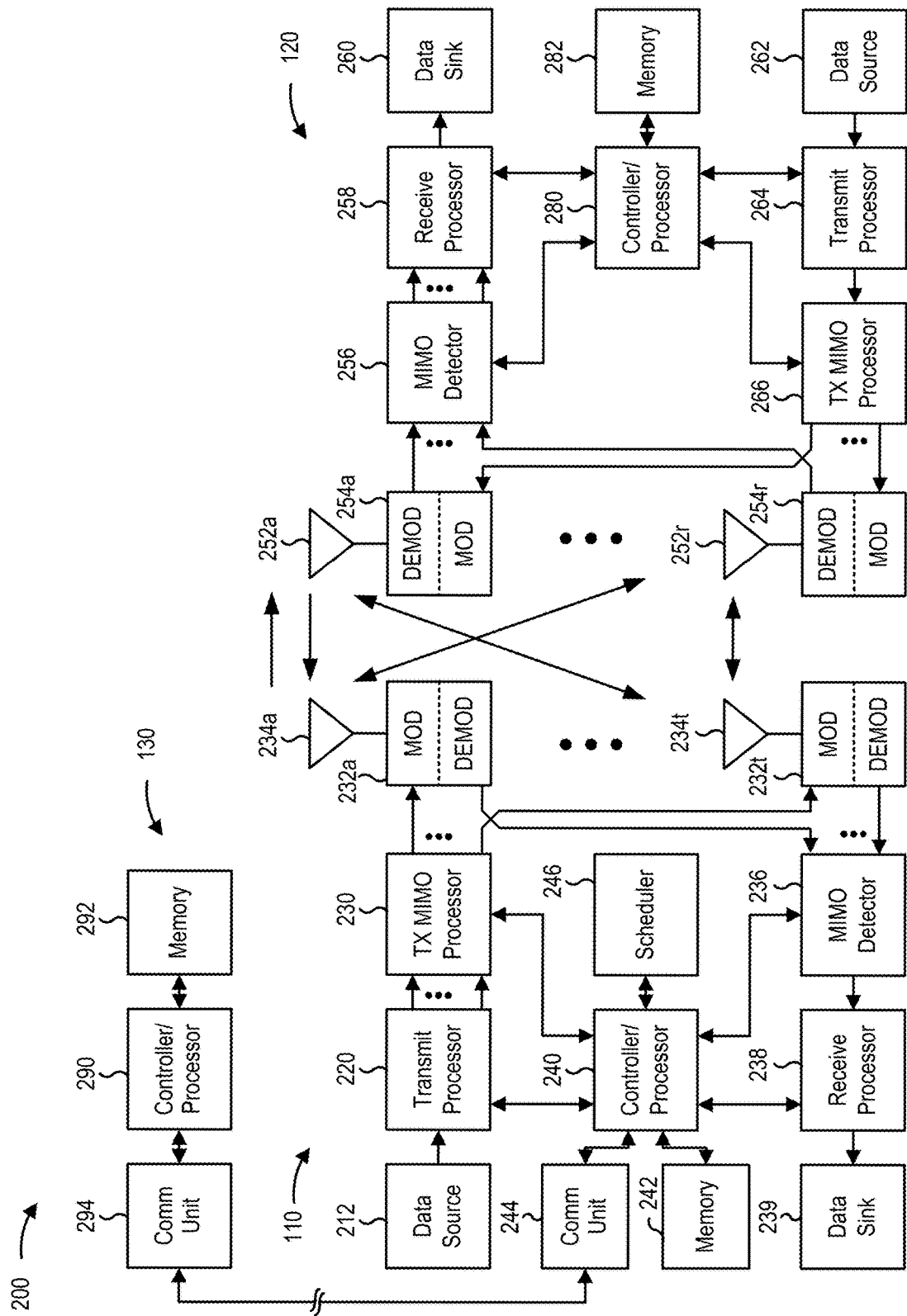
FIG. 2 is a block diagram conceptually illustrating an example of a base station in communication with a user equipment (UE) in a wireless communications network, in accordance with various aspects of the present disclosure.

FIG. 2 shows a block diagram of a design 200 of the base station 110 and UE 120, which may be one of the base stations and one of the UEs in FIG. 1. The base station 110 may be equipped with T antennas 234*a* through 234*t*, and UE 120 may be equipped with R antennas 252*a* through 252*r*, where in general T≥1 and R≥1.

At the base station 110, a transmit processor 220 may receive data from a data source 212 for one or more UEs, select one or more modulation and coding schemes (MCS) for each UE based at least in part on channel quality indicators (CQIs) received from the UE, process (for example, encode and modulate) the data for each UE based at least in part on the MCS(s) selected for the UE, and provide data symbols for all UEs. Decreasing the MCS lowers throughput but increases reliability of the transmission. The transmit processor 220 may also process system information (for example, for semi-static resource partitioning information (SRPI) and/or the like) and control information (for example, CQI requests, grants, upper layer signaling, and/or the like) and provide overhead symbols and control symbols. The transmit processor 220 may also generate reference symbols for reference signals (for example, the cell-specific reference signal (CRS)) and synchronization signals (for example, the primary synchronization signal (PSS) and secondary synchronization signal (SSS)). A transmit (TX) multiple-input multiple-output (MIMO) processor 230 may perform spatial processing (for example, precoding) on the data symbols, the control symbols, the overhead symbols, and/or the reference symbols, if applicable, and may provide T output symbol streams to T modulators (MODs) 232*a* through 232*t*. Each modulator 232 may process a respective output symbol stream (for example, for OFDM and/or the like) to obtain an output sample stream. Each modulator 232 may further process (for example, convert to analog, amplify, filter, and upconvert) the output sample stream to obtain a downlink signal. T downlink signals from modulators 232*a* through 232*t* may be transmitted via T antennas 234*a* through 234*t*, respectively. According to various aspects described in more detail below, the synchronization signals can be generated with location encoding to convey additional information.

At the UE 120, antennas 252*a* through 252*r* may receive the downlink signals from the base station 110 and/or other base stations and may provide received signals to demodulators (DEMODs) 254*a* through 254*r*, respectively. Each demodulator 254 may condition (for example, filter, amplify, downconvert, and digitize) a received signal to obtain input samples. Each demodulator 254 may further process the input samples (for example, for OFDM and/or the like) to obtain received symbols. A MIMO detector 256 may obtain received symbols from all R demodulators 254*a* through 254*r*, perform MIMO detection on the received symbols if applicable, and provide detected symbols. A receive processor 258 may process (for example, demodulate and decode) the detected symbols, provide decoded data for the UE 120 to a data sink 260, and provide decoded control information and system information to a controller/processor 280. A channel processor may determine reference signal received power (RSRP), received signal strength indicator (RSSI), reference signal received quality (RSRQ), channel quality indicator (CQI), and/or the like. In some aspects, one or more components of the UE 120 may be included in a housing.

On the uplink, at the UE 120, a transmit processor 264 may receive and process data from a data source 262 and control information (for example, for reports comprising RSRP, RSSI, RSRQ, CQI, and/or the like) from the controller/processor 280. Transmit processor 264 may also generate reference symbols for one or more reference signals. The symbols from the transmit processor 264 may be precoded by a TX MIMO processor 266 if applicable, further processed by modulators 254a through 254r (for example, for DFT-s-OFDM, CP-OFDM, and/or the like), and transmitted to the base station 110. At the base station 110, the uplink signals from the UE 120 and other UEs may be received by the antennas 234, processed by the demodulators 254, detected by a MIMO detector 236 if applicable, and further processed by a receive processor 238 to obtain decoded data and control information sent by the UE 120. The receive processor 238 may provide the decoded data to a data sink 239 and the decoded control information to a controller/processor 240. The base station 110 may include communications unit 244 and communicate to the core network 130 via the communications unit 244. The core network 130 may include a communications unit 294, a controller/processor 290, and a memory 292.

The controller/processor 240 of the base station 110, the controller/processor 280 of the UE 120, and/or any other component(s) of FIG. 2 may perform one or more techniques associated with polar code encoding as described in more detail elsewhere. For example, the controller/processor 240 of the base station 110, the controller/processor 280 of the UE 120, and/or any other component(s) of FIG. 2 may perform or direct operations of, for example, the processes of FIGS. 12 and 13 and/or other processes as described. Memories 242 and 282 may store data and program codes for the base station 110 and UE 120, respectively. A scheduler 246 may schedule UEs for data transmission on the downlink and/or uplink.

Typical wireless communication systems use coherent communication techniques. Coherent communication refers to communication in which a known sequence, such as a pilot signal (for example, a DMRS), is transmitted in conjunction with another signal, such as a data signal.

Figure 3:
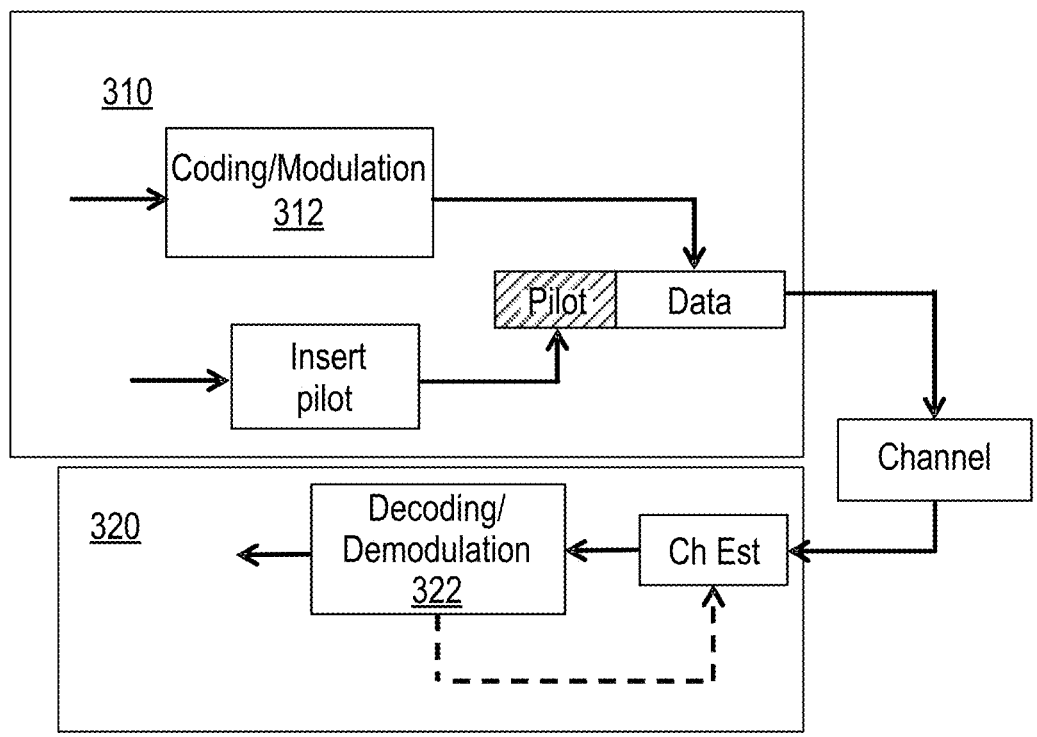
FIG. 3 is a block diagram illustrating a coherent communication system.

FIG. 3 is a block diagram illustrating a coherent communications system 300. In FIG. 3, the coherent communications system 300 includes a transmitter 310 and a receiver 320. The transmitter 310 includes a coding and modulation block 312, which may be the same as the modulation blocks 232, 254 of FIG. 2. The receiver 320 includes a decoding and demodulation block 322, which may be the same as the demodulation blocks 232, 254 of FIG. 2.

For wireless communications across a wireless channel, the transmitter 310 inserts a pilot signal, such as a DMRS, into a signal corresponding to a coded and modulated signal from the coding and modulation block 312. The transmitter 310 transmits the pilot signal along with the coded and modulated signal across the channel to the receiver 320. The receiver 320 performs a channel estimate based on the received pilot signal. Using the channel estimate, the decoding and demodulation block 322 performs demodulation and decoding of the received signal. It is noted that the transmitter 310 can be a UE or a base station. In the case of a UE, the UE may transmit the coded and modulated signal over an uplink control channel to a base station or may transmit the coded and modulated signal over a sidelink channel to another UE.

Coherent communication may also be referred to as DMRS-based communication. Unfortunately, coherent communication may not be optimal in some wireless communication environments or scenarios, such as when a transmitting device is located at a cell edge where a signal received from a base station has a low signal-to-noise ratio (SNR). To improve performance when received signals have a low SNR, non-coherent communication techniques may be considered in which a pilot signal is not transmitted in conjunction with a data or other signal.

Figure 4:
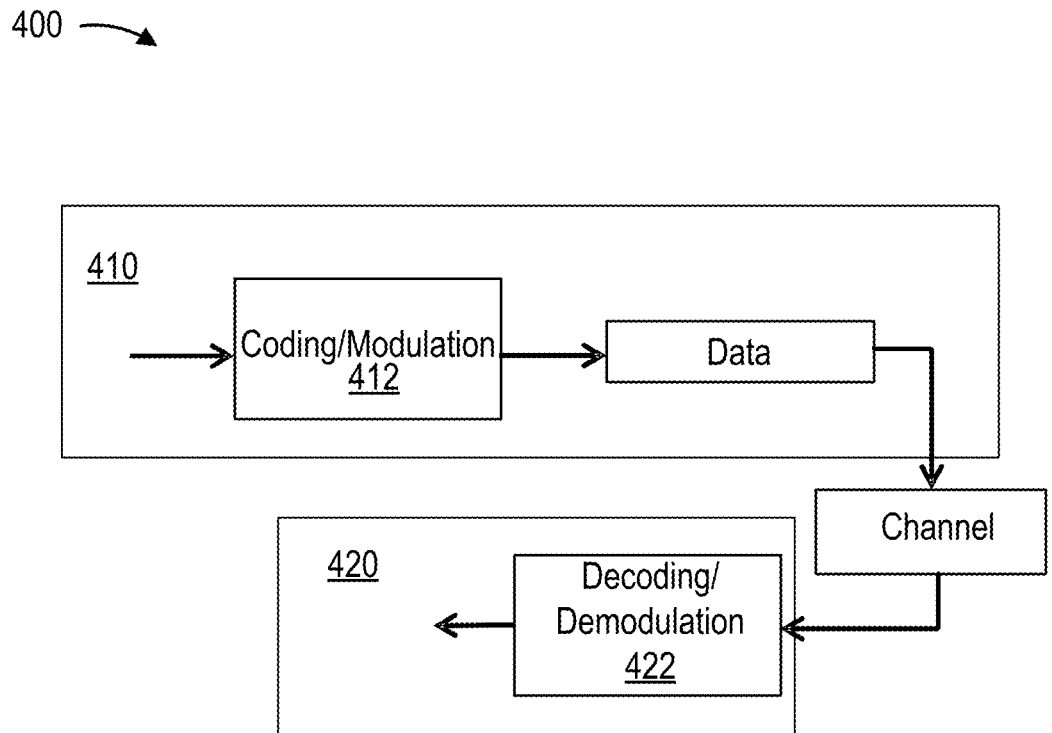
FIG. 4 is a block diagram illustrating a non-coherent communication system.

FIG. 4 is a block diagram illustrating a non-coherent communications system 400. In FIG. 4, the non-coherent communications system 400 includes a transmitter 410 and a receiver 420. The transmitter 410 includes a coding and modulation block 412, which may be the same as the modulation blocks 232, 254 of FIG. 2. The receiver 420 includes a decoding and demodulation block 422, which may be the same as the demodulation blocks 232, 254 of FIG. 2.

For non-coherent wireless communications across a wireless channel, the transmitter 410 does not insert a pilot signal, such as a DMRS, into a signal for transmission. The coding and modulation block 412 encodes and modulates data to generate the signal for transmission. The transmitter 410 transmits the coded and modulated signal across the channel to the receiver 420. The receiver 420 infers the information directly from the received signal without performing channel estimation. That is, the decoding and demodulation block 422 demodulates and decodes the signal to obtain the transmitted data. Any channel estimates by the receiver 420 may result from a receiving algorithm, after successfully decoding the data, without the benefit of a pilot signal. It is noted that the transmitter 410 can be a UE or a base station. In the case of a UE, the UE may transmit the coded and modulated signal over an uplink control channel to a base station or may transmit the coded and modulated signal over a sidelink channel to another UE. The following description is with respect to a UE as the transmitter, although the present disclosure is not so limited.

In some non-coherent communication systems, a transmitting device transmits an encoded payload using an existing coding scheme without a pilot signal, such as a DMRS, even in instances of a fading channel. In some cases, such a non-coherent communication technique may result in poor performance. Consider a fading channel input-output relation:

$$y = hx + n,$$

where, $x \in \{-1, +1\}$ is the transmitted signal, y is the received signal, the channel h is a complex number with an unknown phase, and noise is represented by n.

For example, when using some modulation schemes, because the phase of the channel on which a non-coherent communication is transmitted can be arbitrary, a receiver may not be able to detect whether the transmitter has transmitted a +1 or a −1 from the received signal y. Generally, because the polar code encoder is capable of generating a pair of codewords that are bit-flipped relative to each other, the receiver is not able to distinguish two modulated codewords $x_1$ and $x_2$, if $x_1 = -x_2$ where $x_1, x_2 \in \{-1, +1\}^n$ and $x_1$ and $x_2$ denote the complex vectors that contain two transmitted codewords. For example, $x_1$ may be the binary phase shifting key (BPSK) modulated codeword from the values $\{1001\}$ and $x_2$ may be the BPSK modulated codeword from the values $\{0110\}$. Accurate detection may be even more challenging in instances involving a fading channel, where the receiver may not be able to distinguish between these two modulated codewords because it becomes more difficult to decode the received signals as the channel deteriorates.

A code is a function that maps information bits to coded bits. A polar code is a linear block error correcting code. In 5G communications, polar codes have been employed for encoding control information. For polar encoding, information bits are multiplied by a generator matrix to obtain a code vector. For example, the generator matrix is a submatrix of the matrix $$G_m = \begin{bmatrix} 0 & 1 \\ 1 & 1 \end{bmatrix}^{\otimes m} \text{ or } \begin{bmatrix} 1 & 0 \\ 1 & 1 \end{bmatrix}^{\otimes m},$$

where ⊗ represents the Kronecker product (also referred to as a tensor product or a Kronecker power), and m is a parameter that depends on the length of the polar code. In particular, m is equal to $\log_2(N)$, where N denotes the length of the polar code. Polar coding generally involves the identification of channel reliability values associated with a location of an information bit to be encoded. In 5G NR, a sequence of reliability values for respective bit locations may be predetermined. Based on the sequence of reliabilities, the polar code encoder selects the top K bit locations having the largest reliabilities to transmit information bits. The other bit locations, which are not used to encode any information bits, may be referred to as frozen bit locations. In some examples, the polar code encoder may set the input corresponding to the frozen bit locations to zero during the encoding operation. To create a polar code, the columns of the matrix $G_m$ are selected to maximize a properly selected mutual information metric corresponding to the channel reliability.

FIG. 5A is a diagram illustrating a Hadamard matrix from which a generator matrix of a polar may be constructed. FIG. 5B is a diagram illustrating a generator matrix. More specifically, potential information bit locations are denoted as $u_0, u_1, \ldots u_{2^m-1}$ where m=3 so $u_{2^m-1}=u_7$, and m is a parameter that depends on the length of the polar code. In this example, there are eight bit locations $u_0, u_1, \ldots u_7$ in which a UE may place information bits to be encoded. An encoder selects bit locations to transmit information bits to maximize the conditional mutual information between each information bit sent in the information bit location $u_i$ and encoded output $x_0, \ldots, x_{2^m-1}$ conditioned on the information bits sent in the information bit locations $u_0, \ldots, u_{i-1}$. NR systems pre-define a sequence of reliabilities for each of the $2^m$ bit locations. The encoder selects the top K locations having the largest reliabilities to transmit information bits, where K represents the number of columns of the generator matrix shown in FIG. 5B. It is noted that the x's in FIG. 5A represent the multiplication operator and not the encoded output.

In the example of FIG. 5A, the top four information bit locations are $u_3, u_5, u_6, u_7$, corresponding to the fourth column vector $h_3$, sixth column vector $h_5$, seventh column vector $h_6$, and eighth column vector $h_7$ of the generator matrix H. FIG. 5B shows the generator matrix corresponding to the top four information bit locations. For polar coding, the encoding function is:

$$x = Gu, \quad (1)$$

where x represents the encoded output vector (also referred to as a codeword) $[x_0, x_1, x_2, x_3, x_4, x_5, x_6, x_7]$, the vector $u=[u_3, u_5, u_6, u_7]$, and G is an 8×4 matrix obtained by concatenating the four column vectors that correspond to the top four locations having the largest reliabilities, in this example, the fourth column vector $h_3$, sixth column vector $h_5$, seventh column vector $h_6$, and eighth column vector $h_7$ of the generator matrix H. The matrix multiplication may be performed in GF (2), which is a finite field of size two. In the example of FIG. 5A, polar encoding generates the codeword $x=(u_3 \times h_3)+(u_5 \times h_5)+(u_6 \times h_6)+(u_7 \times h_7)$. It is noted that the notation $u_i$ refer to the information bits used at the information bit location $u_i$.

In some other examples, for polar coding, the encoding function is:

$$x = uG, \quad (2)$$

where x represents the encoded output vector (also referred to as a codeword, or coded bits) $[x_0, x_1, x_2, x_3, x_4, x_5, x_6, x_7]$, the vector $u=[u_3, u_5, u_6, u_7]$, and G is a 4×8 matrix obtained by concatenating row vectors of the matrix $G_m$ that correspond to the top four bit locations having the largest reliabilities. Equations 1 and 2 may be equivalent because the matrix $G_m$ is a symmetric matrix having a transpose that is equal to the matrix itself.

In FIG. 5A, the eighth column vector $h_7$ corresponding to the information bit location $u_7$ is an all-one vector. Depending on whether the polar code encoder corresponds to the matrix $$\begin{bmatrix} 1 & 0 \\ 1 & 1 \end{bmatrix} \text{ or } \begin{bmatrix} 0 & 1 \\ 1 & 1 \end{bmatrix},$$

the first column vector may be an all-one vector (not shown in FIG. 5) instead of the eighth column vector $h_7$ (for example, a last column vector). The following description assumes the eighth column vector $h_7$ is the all-one vector, although the present disclosure is intended to cover either scenario. For example, assuming the last column consists of all ones, it implies that if the information bit at the information bit location $u_7$ changes from 0 to 1, while keeping the other information bits fixed, the coded bits $x_0, x_1, x_2, x_3, x_4, x_5, x_6,$ and $x_7$ will all be flipped relative to when the information bit location $u_7=0$. This is problematic for non-coherent DMRS-less communications. For example, if the resulting coded bits are modulated using a pi/BPSK or a quadrature phase shifting key (QPSK) modulation, then the modulated symbols will have opposite signs from the modulated symbols of the other set of coded bits (with the first or last information bit set to zero).

Figure 6:
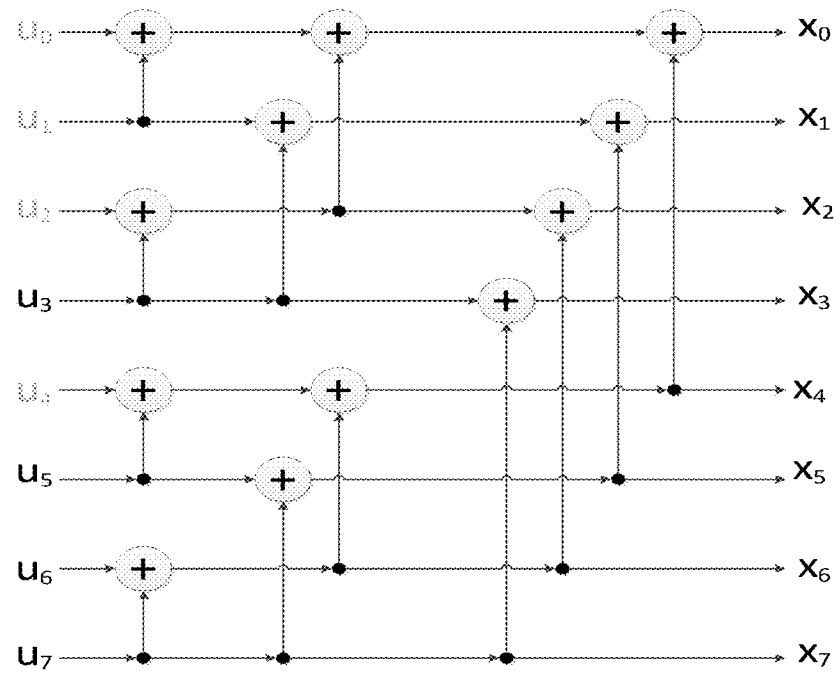
FIG. 6 is a diagram illustrating encoding with a polar code.

FIG. 6 is a diagram illustrating encoding with a polar code. The example polar coding encoder of FIG. 6 is based on the same assumptions as the polar coding encoder described with reference to FIG. 5A, where the information bit locations correspond to the vector $u=[u_3, u_5, u_6, u_7]$. The example of FIG. 6 illustrates a circuit representation, whereas the example of FIG. 5A illustrates a generator matrix representation. In this example, there are eight bit locations $u_0, u_1, \ldots u_7$ in which a UE may place information bits. On the right side of the circuit, encoded bits $x_0, x_1, \ldots x_7$ are shown. Polar coding operates by determining information bit locations $u_0, u_1, \ldots u_7$ and frozen bit locations based on a reliability metric for each bit location. The K bit locations in the example of FIG. 6 corresponding to the highest reliability metrics are information bit locations $u_3, u_5, u_6, u_7$. The other bit locations are frozen. More specifically, in the example of FIG. 6, the encoder maps information bits to the information bit locations $u_3, u_5, u_6, u_7$. The encoder sets the locations $u_0, u_1, u_2, u_4$ to a known value, such as zero, during the encoding. The locations $u_0$, $u_1$, $u_2$, $u_4$, which do not communicate information bits, are referred to as frozen bit locations and the bits used at the frozen bit locations during polar encoding are referred to as frozen bits.

As shown in FIG. 6, the information bit location $u_7$ maps to all output bits $x_0$ to $x_7$. That is, the information bit location $u_7$ maps directly to the coded bit $x_7$. The information bit location $u_7$ maps to the coded bit $x_6$ via the information bit location $u_6$. The information bit location $u_7$ maps to the coded bit $x_5$ via the information bit location $u_5$, and so forth. As described earlier, if the information bit at the information bit location $u_7$ changes from 0 to 1, then all coded bits $x_0$ to $x_6$ will change.

Polar codes have a length $N=2^m$, where m is equal to $\log_2(N)$, where N denotes the length of the polar code. In practice, however, when applying polar coding to wireless applications it may be desirable to generate polar codes with an arbitrary coded length. For example, in NR systems, a resource grid is a multiple of twelve because twelve resource elements are in a resource block. Rate matching techniques may obtain an arbitrary coded length. Wireless standards, such as 5G NR standards, specify three rate matching schemes: repetition, puncturing, and shortening. These three techniques are next described with respect to the example generator matrix of FIG. 5A.

Figure 7:
FIG. 7 is a diagram illustrating a rate-matched polar code encoder in the form of a generator matrix based on a repetition operation.

FIG. 7 is a diagram illustrating a rate-matched polar code encoder in the form of a generator matrix based on a repetition operation. For repetition, some coded bits are repeated. In the example of FIG. 7, the coded bits from the first two rows repeats to create a 10×4 generator matrix, instead of the original 8×4 matrix shown in FIG. 5A. Codewords that are encoded by the 10×4 generator matrix have a length of ten bits. By repetition, the encoder increases the number of coded bits to more than $2^m$ bits (for example, ten is greater than eight). With repetition, the encoder is able to generate a polar code with a desired number of coded bits.

Figure 8:
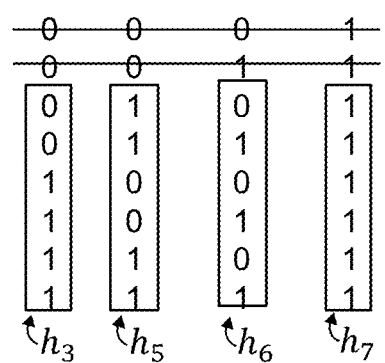
FIG. 8 is a diagram illustrating a rate-matched polar code encoder in the form of a generator matrix based on a puncturing operation.

FIG. 8 is a diagram illustrating a rate-matched polar code encoder in the form of a generator matrix based on a puncturing operation. For puncturing, the UE deletes a number of coded bits. In the example of FIG. 8, the UE removes the first two rows to create a 6×4 generator matrix, instead of the original 8×4 matrix shown in FIG. 5A. Codewords that are encoded by the 6×4 generator matrix have a length of six bits. By puncturing, the encoder decreases the number of coded bits to less than $2^m$ bits (for example, six is less than eight). With puncturing, the encoder is able to generate a polar code with a desired number of coded bits.

Figure 9:
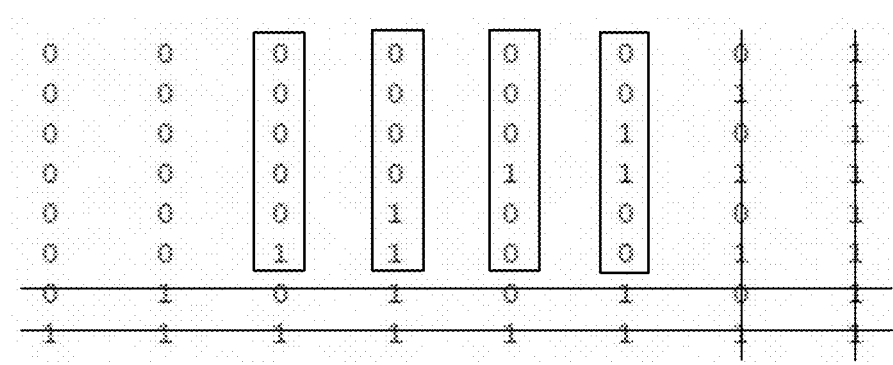
FIG. 9 is a diagram illustrating a rate-matched polar code encoder in the form of a generator matrix based on a shortening operation.

FIG. 9 is a diagram illustrating a rate-matched polar code encoder in the form of a generator matrix based on a shortening operation. For shortening, the UE deletes coded bits and the corresponding locations of the information bits. Deleting is equivalent to treating these bits as known bits for the encoder and decoder. The UE selects different column vectors, after the deleting, based on reliabilities associated with each of the bit locations (for example, remaining bit locations). In the example of FIG. 9, the UE deletes the last two rows and the last two columns to create a 6×4 generator matrix. The UE selects the last four columns in the example of FIG. 9. Codewords that are encoded by the 6×4 generator matrix have a length of six bits. With shortening, the encoder decreases the number of coded bits to less than T" bits (for example, six is less than eight). With shortening, the encoder is able to generate a polar code with a desired number of coded bits.

According to aspects of the present disclosure, when the UE rate matches the polar code by repetition or puncturing, the UE modifies the polar code encoder. More specifically, the UE determines if the rate-matching scheme is repetition, puncturing, or shortening. If the encoder uses repetition or puncturing, then the UE performs the modification before transmitting over the wireless channel. That is, the UE removes the all-one vector, freezes the bitlocation corresponding to the all-one vector or appends/prepends a zero bit to obtain a vector of the original size for encoding by the original polar encoder. If the encoder uses shortening, then the UE will not modify the encoder. That is, the UE uses the original, unmodified polar encoding when the encoder rate matches with a shortening operation. By modifying the polar code encoder as described, non-coherent communications are improved. For example, communications become more reliable over a fading channel with an unknown phase, such as when communicating from a cell edge. For example, if a UE transmits a codeword having values of 0110010, even if a receiver decodes the codeword with the flipped values 1001101 due to the unknown phase, the receiver will recognize the values because the values 1001101 and 0110010 have the same meaning with the modified encoder. In NR systems, the encoder sets the input corresponding to the frozen bit locations to zero during encoding.

Various aspects disclosed relate generally to polar coding techniques for non-coherent communication. Some aspects more specifically relate to constructing a polar code encoder that, during an encoding operation, is incapable of generating any codeword that is a bit-flipped counterpart of any codeword that the polar code encoder can generate. In some aspects, a UE may modify an original polar code encoder, for example, by modifying a generator matrix for the polar code encoder. By modifying the polar code encoder, the polar code encoder is rendered incapable of generating any codeword that is a bit-flipped version of any other codeword that the polar code encoder can generate. For example, if the modified polar code encoder can generate a codeword having values of 0110010, the polar code encoder cannot generate a codeword having values of 1001101. The UE may then encode information bits using the modified polar code encoder to generate a codeword that the UE may then modulate onto a carrier and transmit without transmitting a known sequence, such as a DMRS, along with the codeword.

The UE may implement and modify the polar code encoder with various techniques. For example, in some implementations, the modified polar encoder is modified by removing the all-one column vector or the all-one row vectors in the generator matrix. As described above, whether the all-one column or row vector is the first or last vector is determined based on which two-by-two matrix $$\begin{bmatrix} 1 & 0 \\ 1 & 1 \end{bmatrix} \text{ or } \begin{bmatrix} 0 & 1 \\ 1 & 1 \end{bmatrix}$$

the encoder selects. In such implementations, the modified polar encoder is obtained from the modified generator matrix that excludes the all-one column or row vector. The modified polar encoder then encodes one less bit than the original polar encoder that included the all-one column or row vector to ensure that the modified polar code encoding operation is incapable of generating any codeword that is a bit-flipped counterpart of any codeword that the modified polar code encoding operation can generate.

In some other implementations, the encoder may prepend or append a zero bit to K−1 information bits, (where K is the number of columns in the generator matrix) to obtain a new set of bits in a K-bit vector. The generator matrix is not affected by these implementations. For example, the modified polar encoder may append or prepend a zero bit to the K−1 information bits [x0,x1, . . . ,x_{K−2}] to obtain a new vector [x0,x1, . . . ,x_{K−2},0] or [0, x0,x1, . . . ,x_{K−2}] having K bits. The K−1 information bits are one fewer bit than the original number of bits to be encoded. The encoder then encodes the new set of bits in the K-bit vector, with the added zero, using the original polar code encoder.

In still other implementations, when determining the information bit locations and frozen bit locations for a circuit representation of the polar code encoder, the UE freezes the bit location having the highest reliability. As described above, based on the sequence of reliabilities, the modified encoder selects the top K bit locations having the largest reliabilities as information bit locations, wherein the selection excludes the bit location corresponding to the all-one vector in the generator matrix representation. The other bit locations of the generator matrix, which are not used to encode any information bits, are referred to as frozen bit locations and the bits placed at the frozen bit locations during polar encoding are referred to as frozen bits. It is noted that freezing the bit location corresponding to the all-one vector is mathematically equivalent to removing the all-one column vector from the generator matrix.

Figures 10A, 10B, 10C:
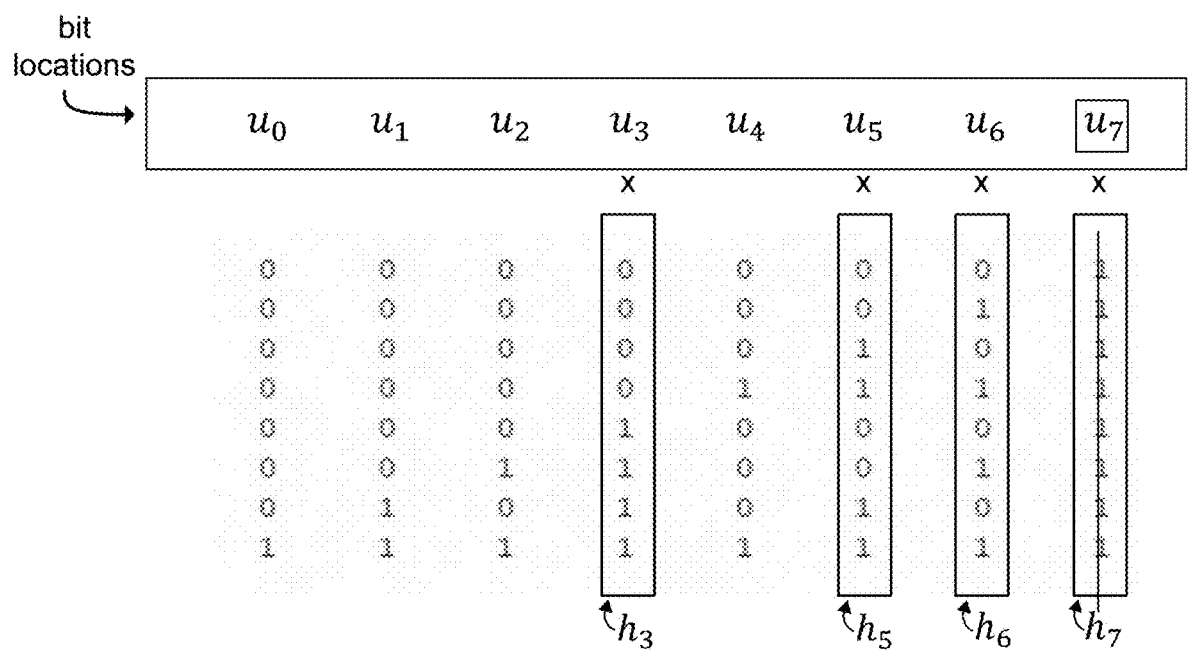
FIG. 10A is a diagram illustrating a modified polar code encoder in the form of a modified generator matrix based on a modification operation, in accordance with some aspects of the present disclosure.
FIG. 10B is a diagram illustrating a polar code encoder in the form of a generator matrix, in accordance with some aspects of the present disclosure.
FIG. 10C is a diagram illustrating a modified polar code encoder in the form of a modified generator matrix based on a modification operation, in accordance with some aspects of the present disclosure.
Figure 11:
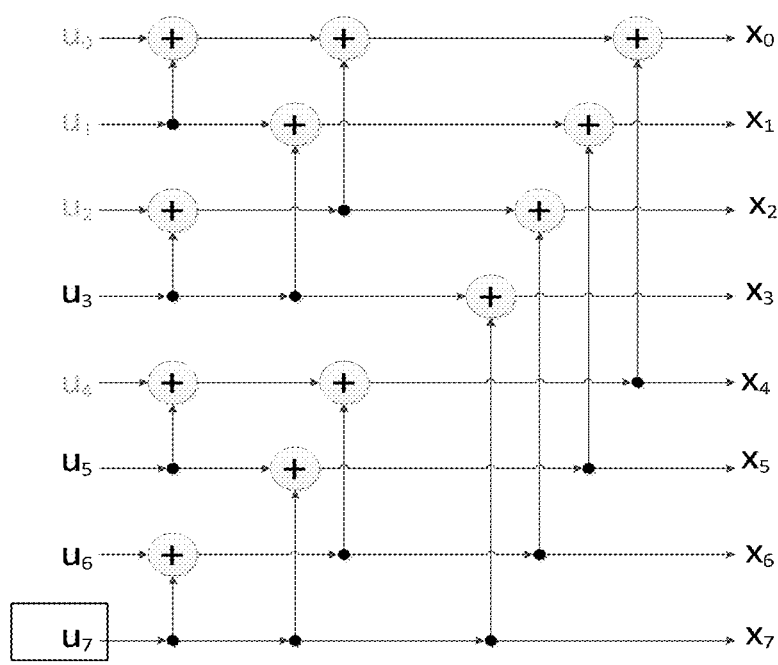
FIG. 11 is a diagram illustrating a modified polar encoder in the form of a circuit based on a modification operation, in accordance with some aspects of the present disclosure.

FIG. 10A is a diagram illustrating a modified polar code encoder in the form of a modified generator matrix based on a modification operation, in accordance with some aspects of the present disclosure. FIG. 10B is a diagram illustrating a polar code encoder in the form of a generator matrix, in accordance with some aspects of the present disclosure. FIG. 10C is a diagram illustrating a modified polar code encoder in the form of a modified generator matrix based on a modification operation, in accordance with some aspects of the present disclosure. FIG. 11 is a diagram illustrating a modified polar encoder in the form of a circuit based on a modification operation, in accordance with some aspects of the present disclosure. As described above, the bit location associated with the highest reliability in a conventional polar encoder include the bit location that corresponds to the all-one vector in the generator matrix, which has the highest reliability. In the modified polar encoder, the UE freezes this particular bit location, in addition to freezing other bit locations of the generator matrix based on the reliability ranking (for example, the bit locations that are frozen based on having a lower reliability). In the examples of FIG. 10A and FIG. 11, the UE sets the bit location 117 to a frozen bit location. In other implementations, the UE sets $u_7=0$. Equivalently, the all-one vector $h_7$ in the generator matrix is not used. For example, FIG. 10B shows the generator matrix prior to modifying. FIG. 10C shows the modified generator matrix removing the all-one vector $h_7$.

Figure 12:
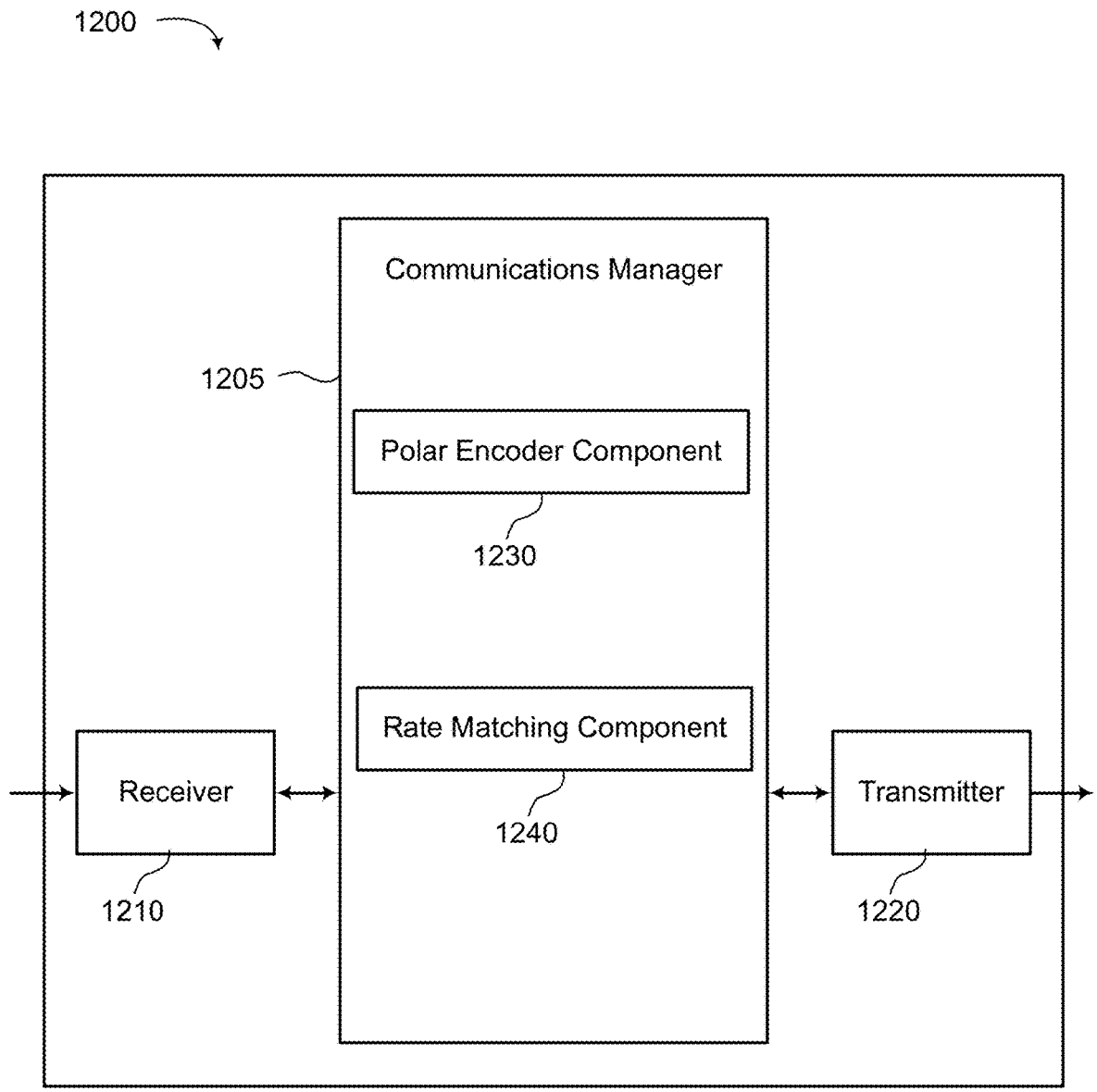
FIG. 12 is a block diagram illustrating an example wireless communication device that supports non-coherent communication associated with polar coding, in accordance with some aspects of the present disclosure.

FIG. 12 is a block diagram illustrating an example wireless communication device that supports non-coherent communication associated with polar coding in accordance with some aspects of the present disclosure. The device 1200 may be an example of aspects of a UE 120 or base station 110 described with reference to FIGS. 1 and 2. The wireless communications device 1200 may include a receiver 1210, a communications manager 1205, a transmitter 1220, a polar encoder component 1230, and a rate matching component 1240, which may be in communication with one another (for example, via one or more buses). In some examples, the wireless communications device 1200 is configured to perform operations, including operations of the processes 1300, 1400 described below with reference to FIGS. 13 and 14.

In some examples, the wireless communications device 1200 can include a chip, chipset, package, or device that includes at least one processor and at least one modem (for example, a 5G modem or other cellular modem). In some examples, the communications manager 1205, or its subcomponents, may be separate and distinct components. In some examples, at least some components of the communications manager 1205 are implemented at least in part as software stored in a memory. For example, portions of one or more of the components of the communications manager 1205 can be implemented as non-transitory code executable by the processor to perform the functions or operations of the respective component.

The receiver 1210 may receive one or more of reference signals (for example, periodically configured channel state information reference signals (CSI-RSs), aperiodically configured CSI-RSs, or multi-beam-specific reference signals), synchronization signals (for example, synchronization signal blocks (SSBs)), control information and data information, such as in the form of packets, from one or more other wireless communications devices via various channels including control channels (for example, a physical downlink control channel (PDCCH) or physical uplink control channel (PUCCH)) and data channels (for example, a physical downlink shared channel (PDSCH) or a physical uplink shared channel (PUSCH)). The other wireless communications devices may include, but are not limited to, a base station 110 or UE 120 described with reference to FIG. 1.

The received information may be passed on to other components of the device 1200. The receiver 1210 may be an example of aspects of the receive processor 238, 258 described with reference to FIG. 2. The receiver 1210 may include a set of radio frequency (RF) chains that are coupled with or otherwise utilize a set of antennas (for example, the set of antennas may be an example of aspects of the antennas 252a, 234a through 252r, 234t described with reference to FIG. 2).

The transmitter 1220 may transmit signals generated by the communications manager 1205 or other components of the wireless communications device 1200. In some examples, the transmitter 1220 may be collocated with the receiver 1210 in a transceiver. The transmitter 1220 may be an example of aspects of the transmit processor 220, 264 described with reference to FIG. 2. The transmitter 1220 may be coupled with or otherwise utilize a set of antennas (for example, the set of antennas may be an example of aspects of the antennas 252a, 234a through 252r, 234t described with reference to FIG. 2), which may be antenna elements shared with the receiver 1210. In some examples, the transmitter 1220 is configured to transmit control information in a PUCCH or PDCCH and data in a physical uplink shared channel (PUSCH) or PDSCH.

The communications manager 1205 may be an example of aspects of the controller/processor 240, 280 described with reference to FIG. 2. The communications manager 1205 may include the polar encoder component 1230 and the rate matching component 1240. In some implementations, the polar encoder component 1230 may generate information bits for transmission to another wireless communication device; identify a configuration for a polar code encoder for encoding the information bits; and encode a set of the information bits with a polar code encoding operation based on the configuration to generate a codeword. Working in conjunction with the transmitter 1220, the polar encoder component 1230 may also transmit the codeword via a wireless channel without a reference signal.

In some implementations, the rate matching component 1240 may perform a rate matching operation on a set of information bits to adjust a quantity of bits in a codeword. In such implementations, working in conjunction with the polar encoder component 1230, the rate matching component 1240 may encode the information bits with a first polar code encoding operation to generate the codeword based on a type of the rate matching satisfying a first polar code encoding condition. Additionally, working in conjunction with the transmitter 1220, the polar encoder component 1230 may transmit the codeword via a wireless channel without a reference signal.

Figure 13:
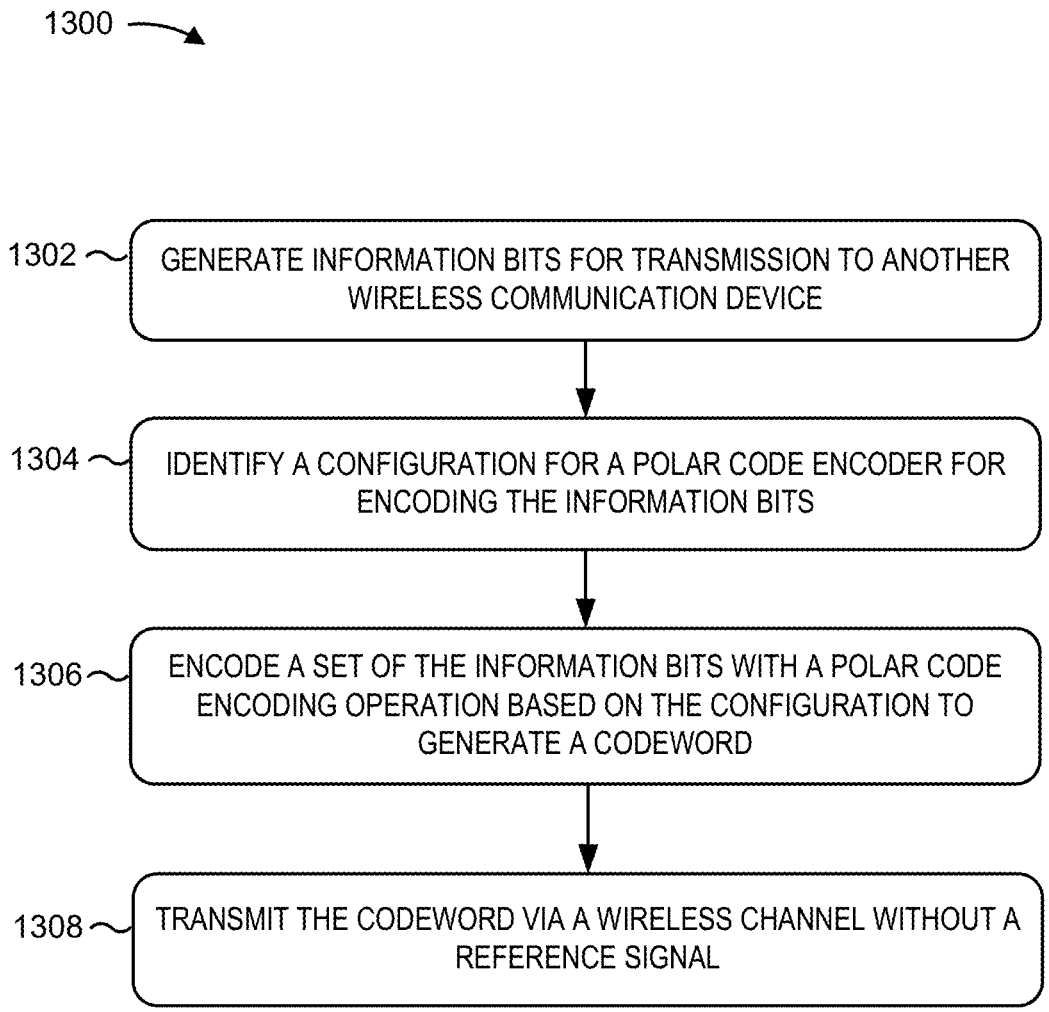
FIG. 13 is a flow diagram illustrating an example non-coherent wireless communication process using polar coding performed by a wireless device, in accordance with some aspects of the present disclosure.

FIG. 13 is a flow diagram illustrating an example non-coherent wireless communication process 1300 using polar coding performed by a wireless device in accordance with some aspects of the present disclosure. The wireless device may be an example of a UE 120 or base station 110 described with reference to FIGS. 1 and 2. The example process 1300 is an example of non-coherent communications associated with polar coding.

The process 1300 begins at block 1302, by generating information bits for transmission to another wireless communication device. At block 1304, the process 1300 identifies a configuration for a polar code encoder for encoding the information bits. At block 1306, the process 1300 encodes a set of the information bits with a polar code encoding operation based on the configuration to generate a codeword. In some examples, the configuration renders the polar code encoding operation incapable of generating a codeword that is a bit-flipped counterpart of another codeword that the polar code encoding operation is capable of generating based on the configuration. Additionally, at block 1308, the process 1300 transmits the codeword via a wireless channel without a reference signal.

Figure 14:
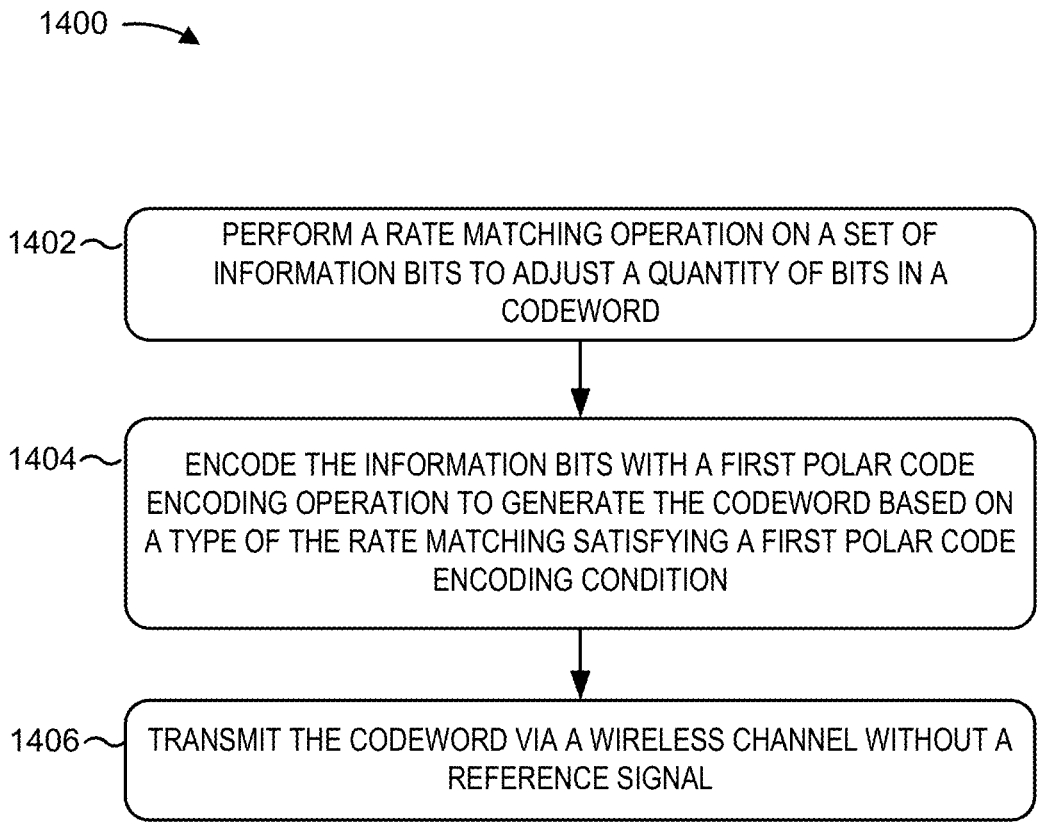
FIG. 14 is a flow diagram illustrating another example non-coherent wireless communication process using polar coding performed by a wireless device, in accordance with some aspects of the present disclosure.

FIG. 14 is a flow diagram illustrating another example non-coherent wireless communication process 1400 using polar coding performed by a wireless device in accordance with some aspects of the present disclosure. The wireless device may be an example of a UE 120 or base station 110 described with reference to FIGS. 1 and 2. The example process 1400 is an example of non-coherent communications associated with polar coding.

As shown in FIG. 14, the process 1400 begins at block 1402, by performing a rate matching operation on a set of information bits to adjust a quantity of bits in a codeword. At block 1404, the process 1400 encodes the information bits with a first polar code encoding operation to generate the codeword based on a type of the rate matching satisfying a first polar code encoding condition. The first polar code encoding condition may be satisfied based on type of the rate matching being a first type of rate matching, such as a repetition operation that increases the quantity of the bits or a puncturing operation that decreases the quantity of the bits. The first polar code encoding condition may not be satisfied based on the type of the rate matching being a second type of rate matching, such as a shortening operation that decreases the quantity of the bits. The first polar code encoding operation may be incapable of generating a codeword that is a bit-flipped counterpart of another codeword that the first polar code encoding operation is capable of generating. In some examples, the information bits are encoded with a second polar code encoding operation to generate the codeword based on the type of the rate matching failing to satisfy the first polar code encoding condition. In such examples, the second polar code encoding operation is capable of generating a codeword that is a bit-flipped counterpart of another codeword that the second polar code encoding operation is capable of generating. As shown in FIG. 14, at block 1406, the process 1400 transmits the codeword via a wireless channel without a reference signal.

Implementation examples are described in the following numbered aspects.

Aspect 1. A method of non-coherent wireless communication performed by a wireless communication device, comprising: generating information bits for transmission to another wireless communication device; identifying a configuration for a polar code encoder for encoding the information bits; encoding a set of the information bits with a polar code encoding operation based on the configuration to generate a codeword, the configuration rendering the polar code encoding operation incapable of generating a codeword that is a bit-flipped counterpart of another codeword that the polar code encoding operation is capable of generating based on the configuration; and transmitting the codeword via a wireless channel without a reference signal.

Aspect 2. The method of Aspect 1, further comprising performing rate matching on the information bits to adjust a quantity of bits in a codeword.

Aspect 3. The method of Aspect 2, wherein the rate matching punctures the information bits to decrease the quantity of the bits.

Aspect 4. The method of Aspect 2, wherein the rate matching repeats the information bits to increase the quantity of the bits.

Aspect 5. The method of any one of Aspects 1-4, wherein the configuration of the polar code encoding operation removes an all-one vector from a generator matrix associated with the polar code encoder.

Aspect 6. The method of any one of Aspects 1-5, wherein encoding the information bits comprises: appending or prepending a zero bit to the information bits to obtain a vector; and encoding the vector using the polar code encoding operation associated with the configuration.

Aspect 7. The method of any one of Aspects 1-6, wherein the configuration of the polar code encoding operation freezes a bit index.

Aspect 8. The method of Aspect 7, wherein the bit index corresponds to a location of an all-one vector associated with the polar encoder.

Aspect 9. The method of Aspect 8, wherein the bit index corresponds to a bit location having a largest reliability among all bit locations of the polar code encoder.

Aspect 10. The method of Aspect 8, wherein: the bit index corresponds to a bit location associated with a column vector or a row vector in an encoding matrix; the column vector having a maximum column weight or the row vector having a maximum row weight in the encoding matrix; and the encoding matrix is associated with the polar code encoder.

Aspect 11. The method of any one of Aspects 1-10, wherein the wireless communication device comprises a first UE.

Aspect 12. The method of claim 11, wherein: the wireless channel is a sidelink channel; and the other wireless communication device is a second UE.

Aspect 13. The method of any one of Aspects 1-10, wherein the wireless communication device is a base station.

Aspect 14. The method of any one of Aspects 1-14, wherein the reference signal is a DMRS.

Aspect 15. A method of non-coherent wireless communication performed by a wireless device, comprising: performing a rate matching operation on a set of information bits to adjust a quantity of bits in a codeword; encoding the information bits with a first polar code encoding operation to generate the codeword based on a type of the rate matching satisfying a first polar code encoding condition; and transmitting the codeword via a wireless channel without a reference signal.

Aspect 16. The method of Aspect 15, wherein: the type of the rate matching satisfies the first polar code encoding condition based on the type being a first type of rate matching; and the type of the rate matching fails to satisfy the first polar code encoding condition based on the type being a second type of rate matching.

Aspect 17. The method of Aspect 16, wherein: the first type of rate matching is: a repetition operation that increases the quantity of the bits; or a puncturing operation that decreases the quantity of the bits; and the second type of rate matching is a shortening operation that decreases the quantity of the bits.

Aspect 18. The method of any one of Aspects 15-17, wherein the first polar code encoding operation is incapable of generating a codeword that is a bit-flipped counterpart of another codeword that the first polar code encoding operation is capable of generating.

Aspect 19. The method of any one of Aspects 15-18, further comprising encoding the information bits with a second polar code encoding operation to generate the codeword based on the type of the rate matching failing to satisfy the first polar code encoding condition, wherein the second polar code encoding operation is capable of generating a codeword that is a bit-flipped counterpart of another codeword that the second polar code encoding operation is capable of generating.

Aspect 20. The method of any one of Aspects 15-19, wherein the wireless device is a UE.

Aspect 21. The method of any one of Aspects 15-19, wherein the wireless device is a base station.

Aspect 22. The method of any one of Aspects 15-21, wherein the reference signal is a DMRS.

The foregoing disclosure provides illustration and description, but is not intended to be exhaustive or to limit the aspects to the precise form disclosed. Modifications and variations may be made in light of the above disclosure or may be acquired from practice of the aspects.

As used, the term "component" is intended to be broadly construed as hardware, firmware, and/or a combination of hardware and software. As used, a processor is implemented in hardware, firmware, and/or a combination of hardware and software.

Some aspects are described in connection with thresholds. As used, satisfying a threshold may, depending on the context, refer to a value being greater than the threshold, greater than or equal to the threshold, less than the threshold, less than or equal to the threshold, equal to the threshold, not equal to the threshold, and/or the like.

It will be apparent that systems and/or methods described may be implemented in different forms of hardware, firmware, and/or a combination of hardware and software. The actual specialized control hardware or software code used to implement these systems and/or methods is not limiting of the aspects. Thus, the operation and behavior of the systems and/or methods were described without reference to specific software code—it being understood that software and hardware can be designed to implement the systems and/or methods based, at least in part, on the description.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (for example, a-a, a-a-a, a-a-b, a-a-c, a-b-b, a-c-c, b-b, b-b-b, b-b-c, c-c, and c-c-c or any other ordering of a, b, and c).

No element, act, or instruction used should be construed as critical or essential unless explicitly described as such. Also, as used, the articles "a" and "an" are intended to include one or more items, and may be used interchangeably with "one or more." Furthermore, as used, the terms "set" and "group" are intended to include one or more items (for example, related items, unrelated items, a combination of related and unrelated items, and/or the like), and may be used interchangeably with "one or more." Where only one item is intended, the phrase "only one" or similar language is used. Also, as used, the terms "has," "have," "having," and/or the like are intended to be open-ended terms. Further, the phrase "based on" is intended to mean "based, at least in part, on" unless explicitly stated otherwise.

As used, "or" is used intended to be interpreted in the inclusive sense, unless otherwise explicitly indicated. For example, "a or b" may include a only, b only, or a combination of a and b. As used, a phrase referring to "at least one of" or "one or more of" a list of items refers to any combination of those items, including single members. For example, "at least one of: a, b, or c" is intended to cover the examples of: a only, b only, c only, a combination of a and b, a combination of a and c, a combination of b and c, and a combination of a and b and c.

What is claimed is:

1. A method of non-coherent wireless communication performed by a wireless communication device, comprising:
   generating information bits for transmission to another wireless communication device;
   identifying a configuration for a polar code encoder for encoding the information bits;
   encoding a set of the information bits with a polar code encoding operation based on the configuration to generate a codeword, the configuration rendering the polar code encoding operation incapable of generating a codeword that is a bit-flipped counterpart of another codeword that the polar code encoding operation is capable of generating based on the configuration; and
   transmitting the codeword via a wireless channel without a reference signal.

2. The method of claim 1, further comprising performing rate matching on the information bits to adjust a quantity of bits in a codeword.

3. The method of claim 2, wherein the rate matching punctures the information bits to decrease the quantity of the bits.

4. The method of claim 2, wherein the rate matching repeats the information bits to increase the quantity of the bits.

5. The method of claim 1, wherein the configuration of the polar code encoding operation removes an all-one vector from a generator matrix associated with the polar code encoder.

6. The method of claim 1, wherein encoding the information bits comprises:
appending or prepending a zero bit to the information bits to obtain a vector; and
encoding the vector using the polar code encoding operation associated with the configuration.

7. The method of claim 1, wherein the configuration of the polar code encoding operation freezes a bit index.

8. The method of claim 7, wherein the bit index corresponds to a location of an all-one vector associated with the polar encoder.

9. The method of claim 8, wherein the bit index corresponds to a bit location having a largest reliability among all bit locations of the polar code encoder.

10. The method of claim 8, wherein:
the bit index corresponds to a bit location associated with a column vector or a row vector in an encoding matrix;
the column vector having a maximum column weight or the row vector having a maximum row weight in the encoding matrix; and
the encoding matrix is associated with the polar code encoder.

11. The method of claim 1, wherein the wireless communication device comprises a first user equipment (UE).

12. The method of claim 11, wherein:
the wireless channel is a sidelink channel; and
the other wireless communication device is a second UE.

13. The method of claim 1, wherein the wireless communication device is a base station.

14. The method of claim 1, wherein the reference signal is a demodulation reference signal (DMRS).

15. A method of non-coherent wireless communication performed by a wireless device, comprising:
performing a rate matching operation on a set of information bits to adjust a quantity of bits in a codeword;
encoding the information bits with a first polar code encoding operation to generate the codeword based on a type of the rate matching satisfying a first polar code encoding condition, wherein the first polar code encoding operation is incapable of generating a codeword that is a bit-flipped counterpart of another codeword that the first polar code encoding operation is capable of generating; and
transmitting the codeword via a wireless channel without a reference signal.

16. The method of claim 15, wherein:
the type of the rate matching satisfies the first polar code encoding condition based on the type being a first type of rate matching; and
the type of the rate matching fails to satisfy the first polar code encoding condition based on the type being a second type of rate matching.

17. The method of claim 16, wherein:
the first type of rate matching is:
a repetition operation that increases the quantity of the bits; or
a puncturing operation that decreases the quantity of the bits; and
the second type of rate matching is a shortening operation that decreases the quantity of the bits.

18. The method of claim 15, further comprising encoding the information bits with a second polar code encoding operation to generate the codeword based on the type of the rate matching failing to satisfy the first polar code encoding condition, wherein the second polar code encoding operation is capable of generating a codeword that is a bit-flipped counterpart of another codeword that the second polar code encoding operation is capable of generating.

19. The method of claim 15, wherein the wireless device is a user equipment (UE).

20. The method of claim 15, wherein the wireless device is a base station.

21. The method of claim 15, wherein the reference signal is a demodulation reference signal (DMRS).

22. A apparatus for non-coherent wireless communication at a wireless communication device, comprising:
a processor;
a memory coupled with the processor; and
instructions stored in the memory and operable, when executed by the processor, to cause the apparatus to:
generate information bits for transmission to another wireless communication device;
identify a configuration for a polar code encoding operation encoder for encoding the information bits;
encode a set of the information bits with a polar code encoding operation based on the configuration to generate a codeword, the configuration rendering the polar code encoding operation incapable of generating a codeword that is a bit-flipped counterpart of another codeword that the polar code encoding operation is capable of generating based on the configuration; and
transmit the codeword via a wireless channel without a reference signal.

23. The apparatus of claim 22, wherein the configuration of the polar code encoding operation removes an all-one vector from a generator matrix associated with the polar code encoder.

24. The apparatus of claim 22, wherein execution of the instructions to encode the information bits cause the apparatus to:
append or prepend a zero bit to the information bits to obtain a vector; and
encode the vector using the polar code encoding operation associated with the configuration.

25. The apparatus of claim 22, wherein the configuration of the polar code encoding operation freezes a bit.

26. A apparatus for non-coherent wireless communication at a wireless communication device, comprising:
a processor;
a memory coupled with the processor; and
instructions stored in the memory and operable, when executed by the processor, to cause the apparatus to:
perform a rate matching operation on a set of information bits to adjust a quantity of bits in a codeword;
encode the information bits with a first polar code encoding operation to generate the codeword based on a type of the rate matching satisfying a first polar code encoding condition, wherein the first polar code encoding operation is incapable of generating a codeword that is a bit-flipped counterpart of another codeword that the first polar code encoding operation is capable of generating; and
transmit the codeword via a wireless channel without a reference signal.

27. The apparatus of claim 26, wherein:
the type of the rate matching satisfies the first polar code encoding condition based on the type being a first type of rate matching; and the type of the rate matching fails to satisfy the first polar code encoding condition based on the type being a second type of rate matching.

28. The apparatus of claim 26, wherein:

execution of the instructions further cause the apparatus to encode the information bits with a second polar code encoding operation to generate the codeword based on the type of the rate matching failing to satisfy the first polar code encoding condition; and the second polar code encoding operation is capable of generating a codeword that is a bit-flipped counterpart of another codeword that the second polar code encoding operation is capable of generating.

\* \* \* \* \*